(12) United States Patent
Sun et al.

(10) Patent No.: US 7,968,462 B1
(45) Date of Patent: Jun. 28, 2011

(54) NOBLE METAL ACTIVATION LAYER

(75) Inventors: Zhi-Wen Sun, San Jose, CA (US); Bob Kong, San Jose, CA (US); Igor Ivanov, Danville, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 309 days.

(21) Appl. No.: 12/267,298

(22) Filed: Nov. 7, 2008

Related U.S. Application Data

(60) Provisional application No. 60/986,583, filed on Nov. 8, 2007, provisional application No. 61/017,490, filed on Dec. 28, 2007.

(51) Int. Cl.
*H01L 21/44* (2006.01)

(52) U.S. Cl. ........ 438/678; 438/613; 438/626; 438/643; 438/655; 257/E21.011

(58) Field of Classification Search .................. None
See application file for complete search history.

(56) References Cited

U.S. PATENT DOCUMENTS

| 6,284,721 B1 * | 9/2001 | Lee .............................. 510/175 |
| 2005/0173701 A1 * | 8/2005 | Kawase et al. .................. 257/40 |

* cited by examiner

*Primary Examiner* — N Drew Richards
*Assistant Examiner* — Kyoung Lee

(57) ABSTRACT

Processes for minimizing contact resistance when using nickel silicide (NiSi) and other similar contact materials are described. These processes include optimizing silicide surface cleaning, silicide surface passivation against oxidation and techniques for diffusion barrier/catalyst layer deposition. Additionally, processes for generating a noble metal (for example platinum, iridium, rhenium, ruthenium, and alloys thereof) activation layer that enables the electroless barrier layer deposition on a NiSi-based contact material are described. The processes may be employed when using NiSi-based materials in other end products. The processes may be employed on silicon-based materials.

24 Claims, 4 Drawing Sheets

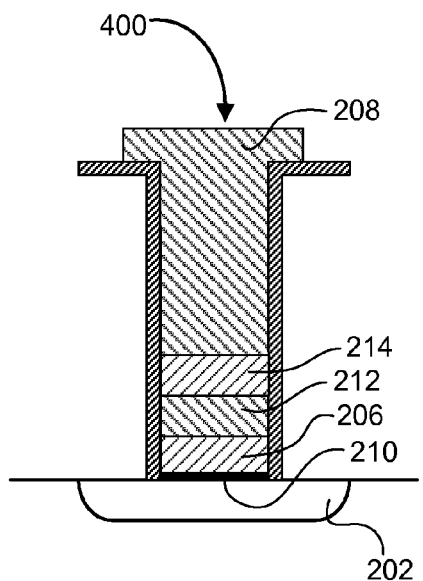
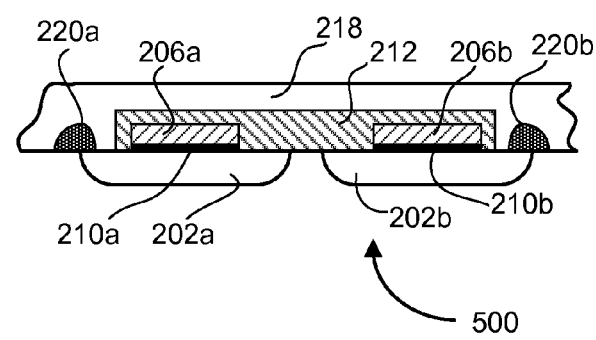
FIG. 4A　　　　　　　　FIG. 4B
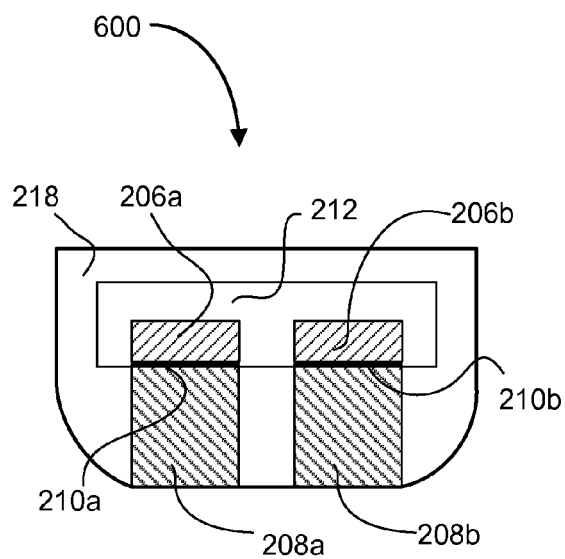
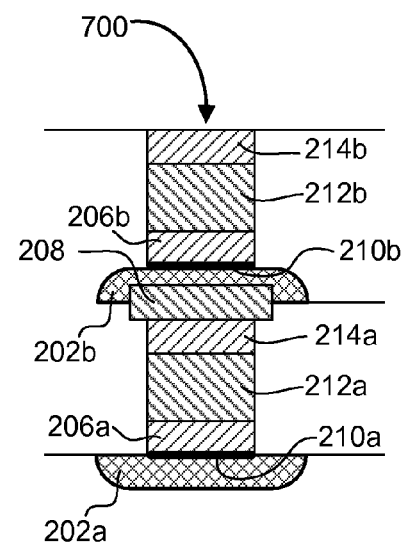
FIG. 4C　　　　　　　　FIG. 4D

US 7,968,462 B1

NOBLE METAL ACTIVATION LAYER

RELATED APPLICATIONS

This application claims the benefit of and priority to U.S. Provisional Patent Application Ser. No. 60/986,583, filed Nov. 8, 2007, and titled SEMICONDUCTOR DEVICE CONTACT INTEGRATION SCHEME and U.S. Provisional Patent Application Ser. No. 61/017,490, filed Dec. 28, 2007, and titled NOBLE METAL ACTIVATION LAYER, the entire disclosures of which are herein incorporated by reference.

FIELD

The present invention relates generally to semiconductor processing. More specifically, it relates to ohmic contact to silicon metallization process.

BACKGROUND

Contact metallization with new contact plug materials (i.e., other than tungsten) is desirable for chip design and manufacturing. Minimizing contact resistance is further desirable for this application, and an adequate diffusion barrier atop of alternative contact materials may improve or enable these applications. In addition, diffusion barrier material possessing catalyst properties for electroless plug deposition is desired.

Ultrathin conformal barrier layer formation by electroless deposition is desirable due to the selective and conformal nature of electroless deposition processes. Since the surface of some contact materials are not catalytic toward direct electroless barrier deposition, techniques are needed for performing electroless deposition on these materials.

Palladium (Pd) is used for activation in electroless deposition processes. However, Pd is undesirable for use with contact metallization due to its diffusion into copper and silicon dioxide ($SiO_2$).

Thus, what are needed are techniques for improving integration of various contact materials in semiconductor devices.

BRIEF DESCRIPTION OF THE DRAWINGS

Various embodiments of the invention are disclosed in the following detailed description and the accompanying drawings:

FIGS. 4A-4D illustrate four alternative contact integration schemes for nonvolatile memory.

DETAILED DESCRIPTION

Figure 1:
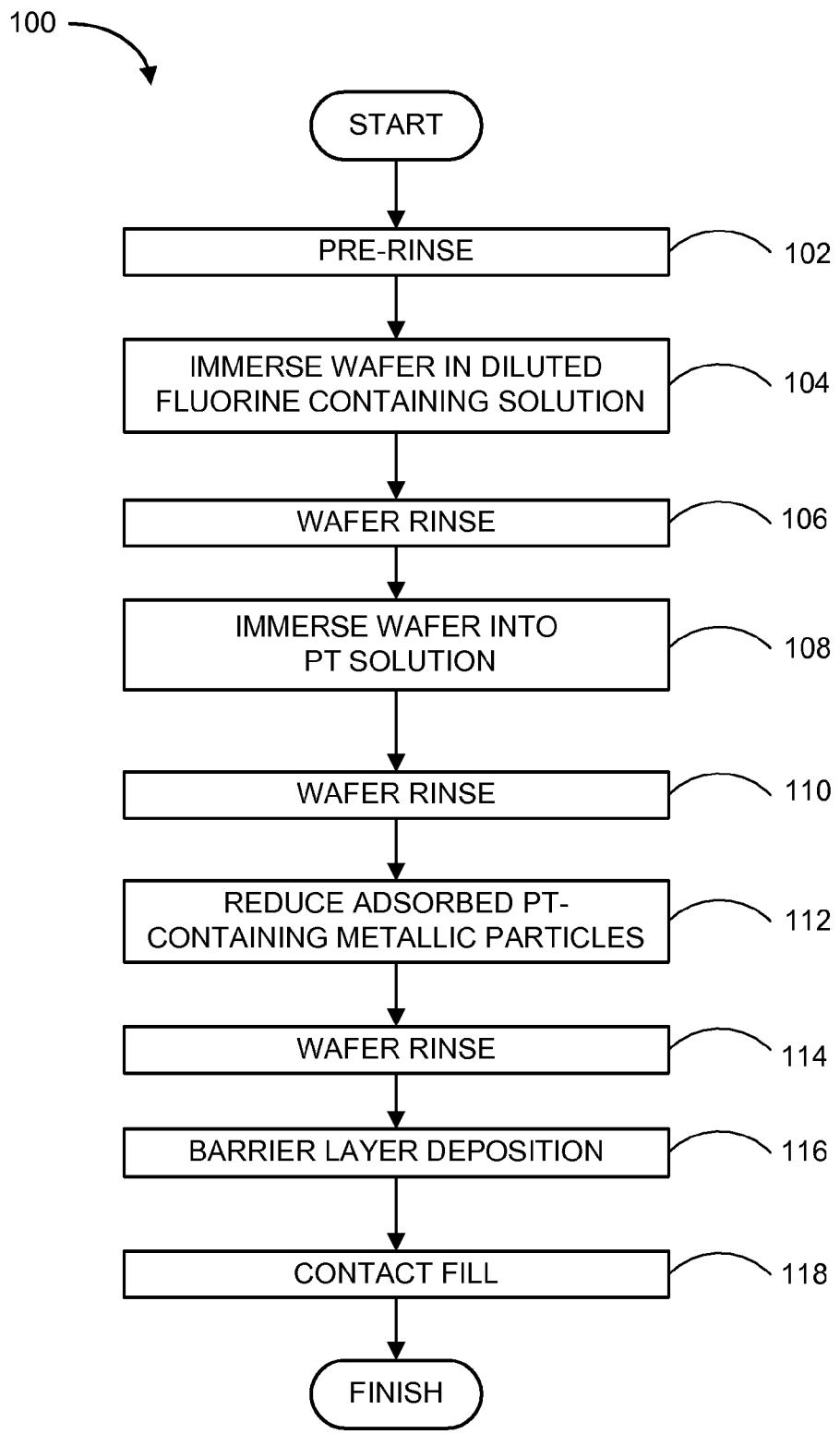
FIG. 1 is a flowchart describing a process for a contact integration scheme according to various embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, processes for minimizing contact resistance when using silicon-based materials and metal silicides (MSi, where M is a metal, for example nickel silicide (NiSi), cobalt silicide (CoSi), titanium silicide (TiSi)) and other similar contact materials are described. These processes include optimizing silicon-surface or silicide-surface cleaning, silicon or silicide surface passivation against oxidation and techniques for diffusion barrier/catalyst layer deposition. Additionally, processes for generating a noble metal (for example platinum, iridium, rhenium, ruthenium, rhodium and alloys thereof) activation layer that enables the electroless barrier layer deposition on a silicon-based or silicide-based contact material are described.

The term "silicon-based" substrate or material as used herein includes crystalline, polycrystalline, and amorphous silicon, which may or may not be doped as an n-type or p-type semiconductive material, as well as silicides. The terms "silicide" and "silicide-based contact material", as used herein, are materials comprising silicon and one or more metals (for example nickel, cobalt, and titanium, alone or in combination) that are more electropositive than silicon. In certain silicides the silicon may be alloyed with germanium (Ge). NiSi, CoSi and TiSi are silicides that, according to some embodiments described herein, are used as a contact in a semiconductor processing scheme. The nickel, cobalt or titanium may be alloyed with rhodium, platinum, iridium, palladium, molybdenum, tungsten, copper, iron, or any combination of these, including, tri-component alloys, quad-component alloys, and higher number-component alloys. Silicide-based contact materials suitable for use in various embodiments include MSi, MPtSi, $MSi_{1-x}Ge_x$ (wherein x ranges from about 0.01 to about 0.9, or from about 0.2 to about 0.8, or from about 0.3 to about 0.7, or from about 0.4 to about 0.6, or even about 0.5), and MIrSi, and any other materials containing a metal and Si as components (e.g., those with >40% atomic ratio). However, although use as a contact material is described, various other uses of silicides are possible, and the techniques for forming electroless layers and for silicide preparation and cleaning are applicable to these other uses.

Silicide Integration Process

A wet process sequence subsequent to contact opening by oxide etching is used to improve silicide integration. The process generally includes silicide surface cleaning/passivation by a composition comprising fluoride ions (for example dilute hydrogen fluoride (HF)) to remove native oxides from silicide-based contact material surfaces, to prevent metal re-oxidation upon contact with air or oxygen-containing environments, and to form a clean silicide-based material. As used herein the term "clean" means simply that native oxides have been removed. In certain embodiments the composition comprising fluoride ions may comprise a sulfide salt, for example $(NH_4)_2S$, alkali metal sulfides (for example $Na_2S$) and alkaline earth metal sulfides (for example calcium sulfide), mixtures of two or more sulfide salts, and organic polysulfides ($R-S_X-R'$), in concentrations further detailed herein. The composition comprising fluoride ions and sulfide salt may be used sequentially or in combination. After cleaning silicide-based material, a selective and conformal electroless plating of a thin film comprising one or more noble metals (Rh, Ir, Ru, Pt or their alloys) atop of only the clean silicide-based material serves as a silicide passivation layer, diffusion barrier, and catalyst layer for metal plug deposition. In certain embodiments the film is an ultra-thin film. As used herein the term "thin" means having thickness of at most 500 atomic diameters of the noble metal (or at most 450, 400, 350, 300, 250, 200, 150, 100 atomic diameters) but no less than 90, 80, 70, 60 or 51 atomic diameters. As used here the term "ultra-thin" means having an average thickness of at most 50 atomic diameters of the noble metal (or at most 45, 40, 35, 30, 25, 20, 15, 10 atomic diameters) but at least 9 (or 8, 7, 6, 5, 4, 3, 2, or even 1) atomic diameters. The metal plug deposition may be by electroless deposition, electrochemical deposition, chemical vapor deposition (CVD), physical vapor deposition (PVD), atomic layer deposition (ALD), any suitable modifications thereof (for example plasma-enhanced CVD).

The silicide surface cleaning/passivation process substantially or completely removes native surface oxides (e.g., $Si_xM_yO_z$) and passivates the silicide surface against re-oxidation. The passivation may include H-passivation for the Si component and S-passivation for the metal component. The electroless noble metal film serves three different purposes for improved process performance: complete silicide surface passivation, as a diffusion barrier, and as a catalyst layer for electroless plug material deposition. The near-neutral or weakly alkaline bath for electroless plug deposition minimizes any potential chemical attack on oxide dielectrics.

The composition comprising fluoride ions (for example HF or $HF/NH_4F$ mixture known as BOE or buffered oxide etch) etches both $SiO_2$ and MO components for the native surface oxide, and the sulfide salt, if present, serves to passivate the metal (M) portion of the surface against re-oxidation. An electroless noble metal film is used to complete silicide surface passivation against re-oxidation, and to serve as the diffusion barrier and the catalyst for contact plug deposition.

Following the surface etching to remove the native oxides on the silicide-based contact materials, and prior to electroless deposition of the conformal barrier layer, a noble metal activation layer is formed by first exposing the clean silicide-based material to a composition comprising noble metal-containing ionic species under conditions sufficient to adsorb noble metal-containing ionic species onto the clean silicide-based material (and any exposed dielectric material surfaces when silicide-based materials are to be used as electrical contact materials), and then selectively reducing the noble metal-containing ionic species to noble metal particles that are able to initiate subsequent barrier layer formation by electroless deposition. Since ionic noble metal-containing ionic species may or may not adsorb on the entire surface of the clean silicide-based material, depending on temperature, concentration, homogeneity of the composition comprising the noble metal-containing ionic species, and other factors, "noble metal activation layer" may exist in a variety of morphologies, ranging from a conformal film, to a structure where the noble metal exists as discrete particles or regions (with clean silicide-based material exposed between the particles or regions).

The sequences described herein offer improved performance in several ways. The electroless barrier layer may comprise any metal elements that can be deposited out of a liquid composition (either aqueous, primarily aqueous, primarily non-aqueous, or non-aqueous), e.g. Co, Mo, W, Ru, Mn, Ir, Sn, Ni, Rh, Re, and other alloying elements such as B, P. Additionally, Pt can form MPtSi by reacting with MSi, thus improving contact performance.

Native Oxide Removal

FIG. 1 is a flowchart describing a process 100 for a silicide integration scheme according to various embodiments. FIGS. 2A-2E illustrate a contact integration scheme according to various embodiments. A wafer, or more generally, a substrate, can be immersed in various baths or otherwise exposed to various liquid or gaseous compositions to perform some of the operations of the process 100.

A pre-rinse step can be optionally performed in operation 102 by immersing the wafer into deionized water (DI), organic alcohol, or combination thereof or in sequence, to improve wafer wetting during the HF etch. The organic alcohols that may be used include methanol, ethanol, and isopropyl alcohol (IPA). The pre-rinse may be performed at any suitable temperature, for example room temperature (about 20 to about 25° C.) and for any suitable time, for example a time ranging from about 5 to about 120 seconds, 10 to 110 seconds, 20 to 100 seconds, 30 to 90 seconds, 40 to 80 seconds, 50 to 70 seconds, or even about 60 seconds.

Figure 2A:
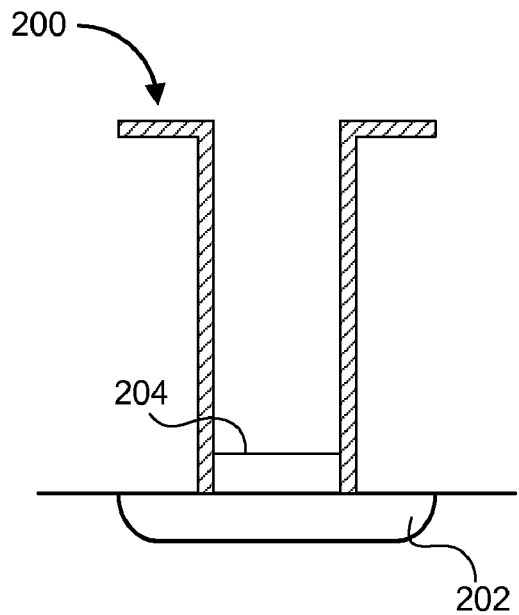
FIGS. 2A-2E illustrates a contact integration scheme according to various embodiments.
Figure 2B:
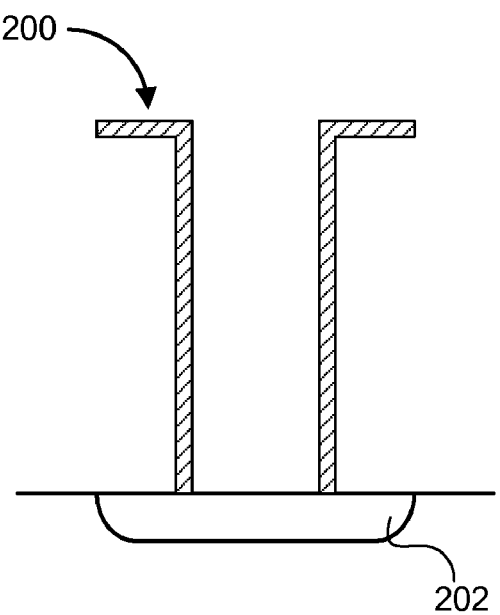

In operation 104, a wafer or substrate is immersed in a fluoride ion-containing composition to remove native oxides on silicide-based materials. FIG. 2A illustrates a portion of a semiconductor substrate 200 that includes a contact material 202 (e.g., a NiSi contact material) having a native oxide 204 formed thereon. Diluted aqueous or semi-aqueous solutions containing HF can be used to remove the native oxide 204 on the surface of silicide-based contact materials (e.g., contact material 202). FIG. 2B illustrates the substrate 200 with the native oxides 204 removed. Examples of diluted HF containing solution include, but are not limited to an aqueous solutions of HF (in concentration ranging from about 50 mg/l to about 10 g/l, 100 mg/l to about 9 g/l, 200 mg/l to about 8 g/l, 300 mg/l to about 7 g/l, 400 mg/l to about 6 g/l, 500 mg/l to about 5 g/l, 600 mg/l to about 4, or 1 g/l to about 3 g/l); an aqueous solution of BOE (buffered oxide etch) having a mixture of HF with $NH_4F$; and other solutions. As an example, Air Products 6:1 BOE solution used in volume concentration ranging from about 0.1 ml/l to about 50 ml/l (or 0.2 ml/l to about 40 ml/l, or 0.3 ml/l to about 30 ml/l, or 0.4 ml/l to about 20 ml/l, or 0.5 ml/l to about 10 ml/l) can be used.

The immersion can be carried out at any temperature, or for example room temperature (about 20 to about 25° C.), or within temperature ranging from about 5 to about 95° C., 10 to 90° C., 15 to 85° C., 20 to 80° C., 25 to 75° C., 30 to 70° C., 35 to 65° C., 40 to 60° C., 45 to 55° C., or even about 50° C. The immersion time can be any length, and for example may vary from 5 seconds to 5 minutes, 10 seconds to 4 minutes, 10 seconds to 3 minutes, 10 seconds to 120 seconds, or 10 to 90 seconds. The immersion etch can be performed using any equipment or tool compatible with the compositions used.

Following the immersion etch step (i.e., operation 104), the wafer or substrate may be rinsed with using any appropriate agent such as DI water, organic alcohol, combination thereof, or in sequence, as indicated in operation 106. The rinse duration can have any time, and for example may vary between 5 seconds to 5 minutes, 15 seconds to 4 minutes, 15 seconds to 3 minutes, 15 seconds to 120 seconds, or 15 to 90 seconds. Any tool set compatible with the compositions used can be used to perform the rinsing, e.g. a spinner running at 10-3000 rpm.

Adsorption of Noble Metal-Containing Ionic Species

In operation 108, the wafer or other substrate is immersed into a composition comprising noble metal-containing ionic species to cause adsorption of noble metal-containing ionic species onto the cleaned silicide material. Suitable compositions comprising noble metal-containing ionic species include aqueous platinum-containing solutions within a wide pH range, used at room temperature (about 20 to about 25° C.) and above to achieve adsorption of noble metal-containing ionic species on the surface of the wafer or other substrate.

Examples of compositions comprising noble metal-containing ionic species include, but are not limited to the following (where X is selected from the group consisting of Pt, Ru, Ir, Rh and combinations thereof):

an aqueous, a primarily aqueous, a primarily non-aqueous, or non-aqueous solution of $H_2Cl_6$ in concentration ranging from about 1 to about 100 millimolar (or 2 to 90 millimolar, or 3 to 80 millimolar, or 4 to 70 millimolar, or 5 to 60 millimolar, or 6 to 50 millimolar, or 7 to 40 millimolar, or 8 to 30 millimolar, or 9 to 20 millimolar, or even 10 to 15 millimolar), mixed with HF in concentration ranging from 10 to about 100 mg/l (or 20 to 90 mg/l, or 30 to about 80 mg/l, or 40 to about 70 mg/l, or 50 to about 60 mg/l, or even 50 mg/l), and an optional anti-oxidant, such as compounds selected from ascorbic acid, quercitin, phenanthroline, nicotinamide, pyruvic acid, glycolic acid, and succinic acid, salts of any of these, derivatives of any of these, and mixtures of two or more of these, in concentration ranging from about 0.1 to about 100 millimolar (or 0.2 to about 90 millimolar, or 0.3 to about 80 millimolar, or 0.4 to about 70 millimolar, or 0.5 to about 60 millimolar, or 0.6 to about 40 millimolar, or 0.7 to about 30 millimolar, or 0.8 to about 20 millimolar, or 0.9 to about 10 millimolar, or 1 to about 5 millimolar, or even about 3 millimolar.

an aqueous, a primarily aqueous, a primarily non-aqueous, or non-aqueous solution of $H_2Cl_6$ in concentration ranging from about 1 to about 100 millimolar (or 2 to 90 millimolar, or 3 to 80 millimolar, or 4 to 70 millimolar, or 5 to 60 millimolar, or 6 to 50 millimolar, or 7 to 40 millimolar, or 8 to 30 millimolar, or 9 to 20 millimolar, or even 10 to 15 millimolar), mixed with a BOE (e.g., Air Products 6:1 BOE) in concentration ranging from about 0.5 to about 10 ml/l can be used, and acetic acid in concentration ranging from about 5 to about 500 millimolar (or 10 to about 400 millimolar, 20 to about 300 millimolar, 30 to about 200 millimolar, or 40 to about 100 millimolar, or 50 to 70 millimolar) and pH adjusted to pH ranging from about 3 to about 6 with a mineral acid such as HCl, $H_2SO_4$, and the like, and a quaternary ammonium salt, such as tetramethyl ammonium hydroxide (TMAH) and the like, and the optional addition of an antioxidant;

an aqueous, a primarily aqueous, a primarily non-aqueous, or non-aqueous solution of $H_2Cl_6$ in concentration ranging from about 1 to about 100 millimolar (or 2 to 90 millimolar, or 3 to 80 millimolar, or 4 to 70 millimolar, or 5 to 60 millimolar, or 6 to 50 millimolar, or 7 to 40 millimolar, or 8 to 30 millimolar, or 9 to 20 millimolar, or even 10 to 15 millimolar), mixed with boric acid in concentration ranging from about 5 to about 500 millimolar (or 10 to about 400 millimolar, 20 to about 300 millimolar, 30 to about 200 millimolar, or 40 to about 100 millimolar, or 50 to 70 millimolar), and pH adjusted to pH ranging from about 8 to about 12 with a quaternary ammonium salt, such as tetramethyl ammonium hydroxide (TMAH) and the like, and the optional addition of an antioxidant;

an aqueous, a primarily aqueous, a primarily non-aqueous, or non-aqueous solution of $XCl_2$ in concentration ranging from about 1 to about 100 millimolar (or 2 to 90 millimolar, or 3 to 80 millimolar, or 4 to 70 millimolar, or 5 to 60 millimolar, or 6 to 50 millimolar, or 7 to 40 millimolar, or 8 to 30 millimolar, or 9 to 20 millimolar, or even 10 to 15 millimolar), mixed with a base such as ammonium hydroxide ($NH_4OH$) to adjust pH to range from about 11 to about 13;

an aqueous, a primarily aqueous, a primarily non-aqueous, or non-aqueous solution of $H_2X(OH)_6$ in concentration ranging from about 1 to about 100 millimolar (or 2 to 90 millimolar, or 3 to 80 millimolar, or 4 to 70 millimolar, or 5 to 60 millimolar, or 6 to 50 millimolar, or 7 to 40 millimolar, or 8 to 30 millimolar, or 9 to 20 millimolar, or even 10 to 15 millimolar), mixed with a base such as ammonium hydroxide ($NH_4OH$) or TMAH to adjust pH to range from about 9.5 to about 13.

The time duration for the adsorption step can vary in the range of about 5 seconds to about 5 minutes (or 10 seconds to 4 minutes, 10 seconds to 3 minutes, 10 seconds to 120 seconds, or 15 to 120). In operation 110, an optional DI rinsing with DI water, organic alcohol, or mixture thereof can be added at the end of the adsorption step (i.e., operation 108).

Noble Metal Particle or Activation Layer Formation

In operation 112, adsorbed noble metal-containing ions are reduced on the cleaned NiSi-based materials 202 to form a noble metal activation layer 210 (FIGS. 2C, 2D), sometimes referred to herein as a catalyst layer (in the sense that it allows noble metal to be deposited onto silicide surfaces). Aqueous solutions of chemical reducing agents can be used to selectively reduce the noble metal-containing ionic species to noble metal particles, in certain embodiments forming a noble metal layer 210, to serve as the catalyst layer for subsequent electroless barrier layer deposition. Discontinuous noble metal particles as well as continuous noble metal film (or combinations thereof) can serve as effective catalysts.

Reducing Agent Solutions Include, but are not Limited to:

an aqueous, a primarily aqueous, a primarily non-aqueous, or non-aqueous solution of an alkali metal borohydride (for example $NaBH_4$) or an alkaline earth metal borohydride in concentration ranging from about 0.01 to about 1 molar (0.02 to about 0.9 molar, or 0.03 to about 0.8 molar, or 0.04 to about 0.7 molar, or 0.05 to about 0.6 molar, or 0.06 to about 0.5 molar, 0.07 to about 0.4 molar, 0.08 to about 0.3 molar, 0.09 to about 0.2 molar, or even 0.1 molar) mixed with NaOH in concentration ranging from about 0.01 to about 1 molar (0.02 to about 0.9 molar, or 0.03 to about 0.8 molar, or 0.04 to about 0.7 molar, or 0.05 to about 0.6 molar, or 0.06 to about 0.5 molar, 0.07 to about 0.4 molar, 0.08 to about 0.3 molar, 0.09 to about 0.2 molar, or even 0.1 molar);

an aqueous, a primarily aqueous, a primarily non-aqueous, or non-aqueous solution of a quaternary ammonium borohydride salt, such as $TMABH_4$ in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2), mixed with a quaternary ammonium hydroxide such as TMAH in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2);

an aqueous, a primarily aqueous, a primarily non-aqueous, or non-aqueous solution of a quaternary ammonium boride salt, such as DMAB, in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2), mixed with TMAH in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2);

an aqueous, a primarily aqueous, a primarily non-aqueous, or non-aqueous solution of $H_3PO_2$ in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2), mixed with TMAH in concentration ranging from about 0.01 to about 2.0 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2);

an aqueous, a primarily aqueous, a primarily non-aqueous, or non-aqueous solution of glycoxylic acid in concentration ranging from 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2), mixed with a quaternary ammonium salt such as TMAH in concentration ranging from about 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2);

an aqueous, a primarily aqueous, a primarily non-aqueous, or non-aqueous solution of hydrazine ($N_2H_4$) in concentration ranging from 0.01 to about 2 molar (or 0.02 to about 1.8 molar, or 0.03 to about 1.6 molar, or 0.04 to about 1.4 molar, or 0.05 to about 1.2 molar, or 0.06 to about 1 molar, 0.07 to about 0.8 molar, 0.08 to about 0.6 molar, 0.09 to about 0.4 molar, 0.1 to about 0.2), with pH adjusted, by mineral acids such as HCl, $H_2SO_4$ or bases such as ammonium hydroxide or TMAH, to be within the range of pH 8 to 12.

The operating temperature of the reducing solutions may range from about 20 to about 95° C. (or from about 20 to about 90° C., or from about 30 to about 80° C., or from about 40 to about 80° C., or from about 50 to about 70° C., or even about 60° C.), with time duration ranging from about 5 seconds to about 5 minutes, or from about 5 seconds to about 3 minutes, or from about 50 seconds to about 5 minutes, or from about 1 minute to about 2 minutes. A DI water or organic alcohol, or mixture thereof, or sequential rinse may be carried out at room temperature (about 20 to about 25° C.) in operation 114 following the noble metal catalyst formation step, with a duration ranging from about 5 seconds to about 5 minutes (or from about 5 seconds to about 3 minutes, or from about 50 seconds to about 5 minutes, or from about 1 minute to about 2 minutes).

Electroless Barrier Layer Deposition

Figure 2C:
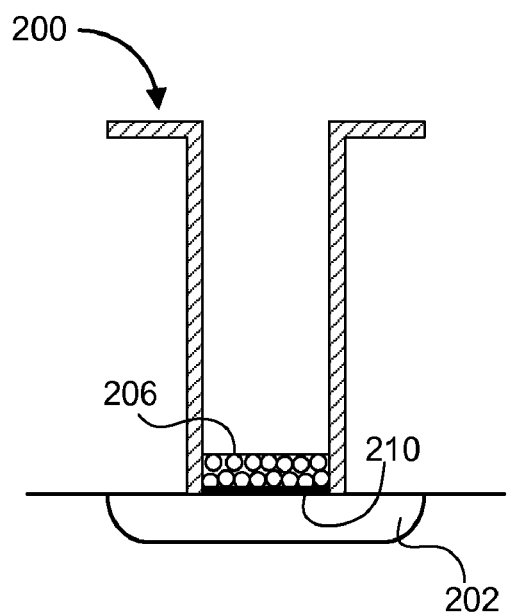

In operation 116, a barrier layer is deposited. FIG. 2C illustrates a deposited barrier layer 206. An electroless barrier layer 206 can be deposited on silicide-based contact materials 202 following the noble metal catalyst formation (210). Any materials or alloys that can be deposited using electroless deposition may be used, and examples include, but are not limited to CoWP, CoMoB, CoMoBP, Ru, Rh, Pt, Co, Ni, Mn, Sn, and Ir and various alloys thereof. The electroless barrier layer can use the noble metal catalyst or activation layer as an activation layer for an electroless plating bath. The electroless bath may include or not include various components, such as metal species (e.g., those listed above) for deposition, reducing agents, complexing agents, stabilizers, surfactants, etc.

Figure 2D:
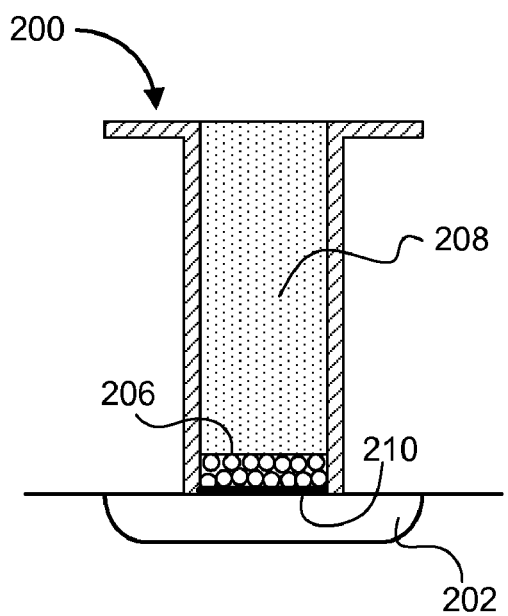
Figure 2E:
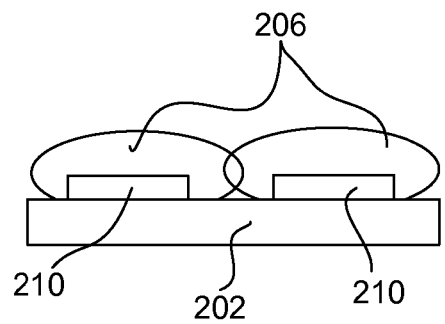

In some embodiments, the barrier layer 206 is a conformal barrier layer 206 that conforms to topography of a patterned substrate. Additionally, in other embodiments, the electroless barrier layer 206 may also form on portions of a cleaned silicon-based material (e.g., the silicide contact 202) not having the activation layer 210 formed thereon. For example, FIG. 2E illustrates a barrier layer 206 forming on the contact materials 202. The activation layers 210 provide anchors to provide sufficient adhesion for the electrolessly formed barrier layer 206. In this embodiment, the barrier layer 206 is formed through conversion (bridging) of nuclei formed on top of the activation layers 210. A subsequent process may be to anneal the substrate 200 so as to form ohmic contacts through Co—Pt—Si or Ni—Pt—Si alloying.

Contact Fill

In operation 118, the contact fill is performed. FIG. 2D illustrates the substrate 200 including a plug 208. Any conductive material, for example copper, aluminum, tungsten, alloys, and other materials may be used to form the plug 208. Contact fill can be performed using electroless deposition, electrochemical deposition, CVD, PVD, ALD, any combination or modification of these (such as plasma-enhanced CVD or any other suitable technique).

Contaminant Removal During Integration

Figure 3A:
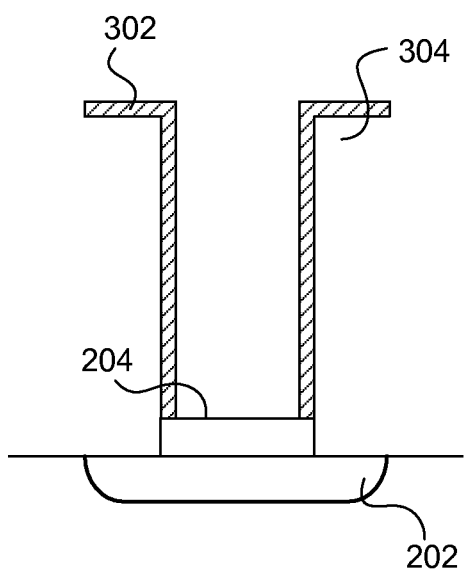
FIGS. 3A and 3B illustrate an alternative contact integration scheme.
Figure 3B:
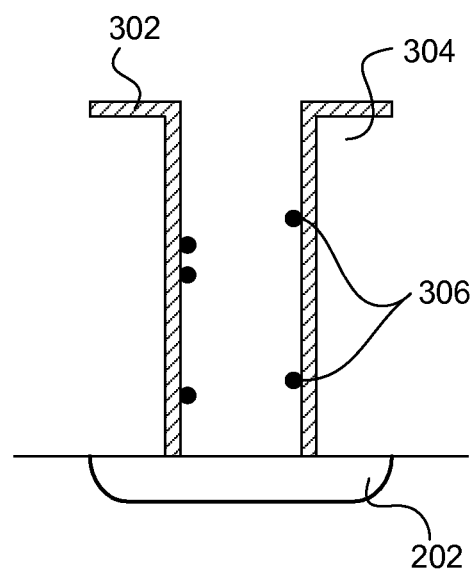

FIGS. 3A and 3B illustrate an alternative contact fill integration scheme. The techniques described herein can be performed before and after operation 104 (cleaning to remove native oxides) described herein. As shown in FIG. 3A, a masking material 302 is deposited on the side walls of a dielectric 304. The masking material 302 may be, for example, a hydrophobic masking material such as one of the silanol-based masking materials described in U.S. patent application Ser. No. 11/647,882, filed on Dec. 29, 2006 and entitled "Substrate Processing Including A Masking Layer", which is herein incorporated by reference. Alternatively, the masking material 302 may be an amphiphilic layer such as is described in Provisional U.S. Patent Application No. 60/949,773, filed on Jul. 13, 2007, and entitled "Methods for Coating a Substrate with an Amphiphilic Compound", which is herein incorporated by reference.

After operation 104, contaminants 306 may be left on the dielectric 304. If masking material 302 is deposited on the dielectric 304, the masking material 302 can trap the contaminants 306. The contaminants 306 can then be removed by removing the masking material 302. In another embodiment, the masking material 302 can impede contaminants 306 attachment by modifying the surface binding properties, including surface chemical groups and zeta potential, of the dielectric 304.

The noble metal activation layer and silicide materials and methods described herein be employed for electroless or electroplating deposition of one or more contact metal electrodes on silicon substrates for solar cell and flat panel displays, as well as other semiconductor structures. The silicon substrates may be crystalline, polycrystalline, or amorphous Si. For example, surface activation of a p-type or n-type Si and subsequent metal contact electrode deposition using electroless or electroplating deposition methods may be employed. For these alternative applications, noble metal activation atop of Si is initiated via the displacement reaction in which the noble metal deposition is accompanied by Si dissolution. High conductivity and low cost interconnect for these applications can be made by subsequent electroless or electroplating deposition of barrier metal such as Co or its alloys and subsequent electroless or electroplating deposition of Cu.

FIGS. 4A-D illustrate cross-sectional views of certain details of four nonvolatile memory structures that can be formed using techniques described herein. Various other memory and other types of semiconductor devices may also be formed using these techniques. Embodiment 400 of FIG. 4A is a "metal-insulator-metal", or "MIM" structure integrating a silicide. For example, embodiment 400 may be a capacitor or memory element and may be part of a larger semiconductor device. Embodiment 400 includes a silicide 202, a noble metal activation layer 210, an electroless noble metal bottom electrode 206, an oxide layer 212, a metal top electrode 214, and a metal interconnect 208.

The noble metal activation layer 210 may be a platinum, ruthenium, rhenium, rhodium, iridium, etc. activation layer formed using techniques described herein. The silicide 202 may be a nickel or other silicide, for example cobalt or titanium. The oxide layer 212 may be a metal or other oxide, such as titanium oxide, aluminum oxide, nickel oxide, etc. or combinations of layers. In one embodiment, the oxide layer 212 is a resistive oxide layer that changes from a low resistance state to a high resistance state when a first voltage is applied across it and from the high resistance state to the low resistance state when a second voltage is applied across it. For example, in a high resistance state, the resistive oxide layer 212 may have a value of 0, while in a low resistance state, the resistive oxide layer 212 has a value of 1.

FIG. 4B is a cross-sectional view of a traditional transistor embodiment 500, having two regions of silicide 202a, 202b, two transistors 220a, 220b, two noble metal activation layers 210a, 210b, and two electroless noble metal electrodes 206a and 206b, as well as an oxide 212 and a protective layer of material 218 such as silicon nitride. The embodiment 500 may be a memory cell and the oxide 212 may be a resistive oxide as described above.

FIG. 4C illustrates a cross-sectional view of another structural embodiment 600, including dual metal interconnects 208a, 208b, dual noble metal activation layers 210a, 210b, and dual electroless noble metal barrier layers 206a, 206b. Structure 600 includes an oxide 212, which may be a resistive oxide to form a resistive memory cell, and a silicon nitride or other protective layer 218.

Embodiment 700 of FIG. 4D is similar to embodiment 400 of FIG. 4A, except that it is a stacked, dual memory element (e.g., two-bit) version, having dual silicide regions 202a, 202b, dual noble metal activation layers 210a, 210b, noble metal electrodes 206a, 206b, oxides 212a, 212b (which may be resistive oxides), and dual metal layers 214a, 214b. A metal electrode 208, for example copper, connects the two memory elements and completes the structure of embodiment 700.

Although the foregoing examples have been described in some detail for purposes of clarity of understanding, the invention is not limited to the details provided. For example, the shapes of the various regions of oxide, silicide, metal, and the like in FIGS. 2 and 4, and the thickness of various layers, such as the activation layer and masking layers in FIG. 3, may or may not be symmetrical from device to device, or even within the same device. There are many alternative ways of implementing the invention. The disclosed examples are illustrative and not restrictive.

What is claimed is:

1. A method comprising:
depositing a masking material on a silicon-based material and removing the masking material;
exposing the silicon-based material to a composition comprising noble metal-containing ionic species, thereby forming a cleaned silicon-based material having adsorbed noble metal-containing species thereon;
reducing all or part of the adsorbed noble metal-containing ionic species to form noble metal particles or a film of noble metal; and
forming an electroless barrier layer over the noble metal.

2. The method of claim 1, wherein forming the electroless barrier layer further comprises forming the electroless barrier layer over any portions of the cleaned silicon-based material not having noble metal thereon.

3. The method of claim 1 comprising exposing the silicon-based material to a composition comprising fluoride ions to form a clean silicon-based material prior to the exposing the silicon-based material to the composition comprising noble metal-containing ionic species.

4. The method of claim 3 further comprising a pre-rinse step performed prior to exposing the silicon-based material to a composition comprising fluoride ions.

5. The method of claim 3 further comprising depositing a masking material on the silicon-based material and removing the masking material prior to the exposing of the silicon-based material to the composition comprising fluoride ions.

6. The method of claim 1 wherein the silicon-based material is a silicide-based material selected from the group consisting of compounds consisting essentially of silicon with one or more elements that are more electropositive than silicon selected from the group consisting of rhodium, platinum, iridium, nickel, palladium, molybdenum, tungsten, copper, iron, cobalt, and any combination of these.

7. The method of claim 6 wherein the silicide-based material is a nickel silicide-based material selected from the group consisting of NiSi, NiPtSi, $NiSi_{1-x}Ge_x$, and NiIrSi, wherein x ranges from about 0.01 to about 0.9.

8. The method of claim 1 wherein the forming a conformal electroless barrier layer over the noble metal particles or film comprises electroless plating of a film of a noble metal or alloys thereof over the noble metal particles or film thereon.

9. The method of claim 1 wherein the forming an electroless barrier layer over the noble metal comprises electrolessly depositing a barrier layer selected from the group consisting of CoWP, CoMoB, CoMoBP, Ru, Rh, Ir and alloys thereof.

10. A method comprising:
exposing a substrate comprising nickel silicide-based material selected from the group consisting of NiSi, NiPtSi, $NiSi_{1-x}Ge_x$, and NiIrSi, wherein x ranges from about 0.01 to about 0.9 to a composition comprising hydrogen fluoride and sodium sulfide to form a clean nickel silicide-based material;
exposing the clean nickel silicide-based material to a composition comprising platinum-containing ionic species, thereby forming a cleaned nickel-silicide based material having adsorbed platinum-containing species thereon;
reducing all of the adsorbed platinum-containing ionic species to form platinum; and
forming a conformal electroless platinum barrier layer over the platinum and any portions of the cleaned nickel-silicide based material not having platinum thereon.

11. The method of claim 10, further comprising depositing a masking material on the nickel silicide-based material and removing the masking material prior to the exposing of the nickel silicide-based material to the composition comprising hydrogen fluoride and sodium sulfide.

12. The method of claim 10, further comprising a pre-rinse step performed prior to exposing the nickel silicide-based material to a composition comprising hydrogen fluoride and sodium sulfide.

13. A method of conductive pattern deposition on silicon-based substrate comprising:
receiving a non-cleaned silicon-based substrate with exposed p-type Si;
forming a masking pattern on the substrate using a process selected from the group consisting of ink-jet printing and direct contact transfer methods; and,
for the areas of the substrate not covered by the masking pattern:

pre-rinsing the substrate using a composition comprising fluoride ions to remove native silicon oxide and form clean Si regions;

adsorbing noble-metal containing ionic species onto the clean Si regions;

reducing the noble-metal containing ionic species to form a noble metal activation layer comprising noble metal particles or thin films; and forming a conformal electroless metal contact film over the noble metal activation layer.

14. The method of claim 13, further comprising depositing metal wiring on the conformal electroless metal contact film using a deposition method selected from electroless deposition and electroplating techniques.

15. The method of claim 14 wherein the metal wiring is copper wiring.

16. A method of semiconductor processing, comprising:

exposing a silicide-based material to a composition comprising noble metal-containing ionic species, thereby forming a cleaned silicide-based material having adsorbed noble metal-containing species thereon, wherein the silicide-based material is selected from the group consisting of compounds consisting essentially of silicon with one or more elements that are more electropositive than silicon selected from the group consisting of rhodium, platinum, iridium, nickel, palladium, molybdenum, tungsten, copper, iron, cobalt, and any combination of these;

reducing all or part of the adsorbed noble metal-containing ionic species to form noble metal particles or a film of noble metal; and forming an electroless barrier layer over the noble metal.

17. The method of claim 16, wherein forming the electroless barrier layer further comprises forming the electroless barrier layer over any portions of the cleaned silicide-based material not having noble metal thereon.

18. The method of claim 16 comprising exposing the silicon-based material to a composition comprising fluoride ions to form a clean silicide-based material prior to the exposing the silicide-based material to the composition comprising noble metal-containing ionic species.

19. A method of semiconductor processing, comprising:

exposing a silicon-based material to a composition comprising noble metal-containing ionic species, thereby forming a cleaned silicon-based material having adsorbed noble metal-containing species thereon;

reducing all or part of the adsorbed noble metal-containing ionic species to form noble metal particles or a film of noble metal; and forming an electroless barrier layer over the noble metal, wherein the forming an electroless barrier layer over the noble metal comprises electrolessly depositing a barrier layer selected from the group consisting of CoWP, CoMoB, CoMoBP, Ru, Rh, Ir and alloys thereof.

20. The method of claim 19, wherein forming the electroless barrier layer further comprises forming the electroless barrier layer over any portions of the cleaned silicon-based material not having noble metal thereon.

21. The method of claim 19, comprising exposing the silicon-based material to a composition comprising fluoride ions to form a clean silicon-based material prior to the exposing the silicon-based material to the composition comprising noble metal-containing ionic species.

22. A method of semiconductor processing, comprising:

exposing a silicon-based material to a composition comprising fluoride ions to form a clean silicon-based material;

depositing a masking material on the clean silicon-based material and removing the masking material;

exposing the clean silicon-based material to a composition comprising noble metal-containing ionic species, thereby forming an adsorbed noble metal-containing species thereon;

reducing all or part of the adsorbed noble metal-containing ionic species to form a film of noble metal; and forming an electroless barrier layer over the film of noble metal.

23. The method of claim 22, further comprising a pre-rinse step performed prior to exposing the silicon-based material to a composition comprising fluoride ions.

24. The method of claim 22, wherein forming the electroless barrier layer further comprises forming the electroless barrier layer over any portions of the clean silicon-based material not having the noble metal film thereon.

* * * * *